United States Patent
Lee (10) Patent No.: US 10,466,399 B2
(45) Date of Patent: Nov. 5, 2019

(54) λ/4 PHASE RETARDATION FILM, DISPLAY APPARATUS AND MANUFACTURING METHOD THEREOF

(71) Applicant: Samsung Display Co., Ltd., Yongin-si, Gyeonggi-do (KR)

(72) Inventor: Dukjin Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 21 days.

(21) Appl. No.: 15/376,404

(22) Filed: Dec. 12, 2016

(65) Prior Publication Data

US 2017/0199312 A1 Jul. 13, 2017

(30) Foreign Application Priority Data

Jan. 8, 2016 (KR) .................. 10-2016-0002733

(51) Int. Cl.
- *G02B 5/30* (2006.01)
- *G06F 3/041* (2006.01)
- *H01L 27/32* (2006.01)
- *H01L 51/52* (2006.01)

(52) U.S. Cl.
CPC ......... *G02B 5/3083* (2013.01); *G06F 3/0412* (2013.01); *G02B 5/3058* (2013.01); *G06F 2203/04103* (2013.01); *H01L 27/323* (2013.01); *H01L 51/5281* (2013.01)

(58) Field of Classification Search
CPC ......... G06F 2203/04103; G06F 3/0412; H01L 51/5281; H01L 51/323
See application file for complete search history.

(56) References Cited

U.S. PATENT DOCUMENTS

| 6,611,299 | B1 * | 8/2003 | Fujii ................... | G02F 1/13338 345/173 |
| 9,158,143 | B2 * | 10/2015 | Chen ................... | G02F 1/13338 |
| 2009/0194344 | A1 * | 8/2009 | Harley ................. | G06F 3/044 178/18.06 |
| 2013/0016047 | A1 * | 1/2013 | Masumoto .......... | G02F 1/13338 345/173 |

(Continued)

FOREIGN PATENT DOCUMENTS

| KR | 10-2015-0012389 | 2/2015 |
| KR | 10-1555080 | 9/2015 |
| KR | 10-1557598 | 10/2015 |

*Primary Examiner* — Mihir K Rayan
(74) *Attorney, Agent, or Firm* — Lewis Roca Rothgerber Christie LLP (57) ABSTRACT

A display apparatus includes a polarizer, a phase retardation film, a touch member, and a display panel. The polarizer has a transmitting axis and is configured to linearly polarize external light to be parallel to the transmitting axis. The phase retardation film is on the polarizer and has a first optical axis. The touch member has a second optical axis and comprises a touch substrate on the polarizer and touch electrodes on the touch substrate. The display panel is on the polarizer. When a first in-plane retardation value of the phase retardation film is $Rp_1$, a second in-plane retardation value of the touch member is $Rp_2$, a phase retardation value within a target surface is $Rp_g$, and a is a constant, an equation $Rp_1 = Rp_g - a*Rp_2$ is satisfied.

18 Claims, 9 Drawing Sheets

(56) References Cited

U.S. PATENT DOCUMENTS

2013/0169593 A1* 7/2013 Imamura .............. G06F 3/0412
                                                    345/174
2016/0259104 A1* 9/2016 Lee .................... G02B 5/3083
2016/0283025 A1* 9/2016 Yang ................... G06F 3/044
2018/0004253 A1* 1/2018 Kang ................... H01H 1/10

* cited by examiner

λ/4 PHASE RETARDATION FILM, DISPLAY APPARATUS AND MANUFACTURING METHOD THEREOF

CROSS-REFERENCE TO RELATED APPLICATIONS

This U.S. non-provisional patent application claims priority under 35 U.S.C. § 119 to and the benefit of Korean Patent Application No. 10-2016-0002733, filed on Jan. 8, 2016 in the Korean Intellectual Property Office, the entire content of which is hereby incorporated by reference.

BACKGROUND

1. Field

Aspects of the present disclosure relate to a λ/4 phase retardation film, display apparatus, and manufacturing method thereof.

2. Description of the Related Art

Flat panel display apparatuses provide miniaturization, slim size, and light weight and may also be driven by relatively low power. Liquid crystal display apparatuses from among the flat panel display apparatuses may be applied to mid- and large-size display apparatuses, such as monitors and televisions, and organic electroluminescence display apparatuses may be applied to portable display apparatuses, such as mobile phones.

When a flat panel display apparatus is applied to a portable display apparatus, the flat panel display apparatus may include a window (e.g., a window substrate) for covering a display panel, and in some cases, the flat panel display apparatus may further include a touch screen panel which detects a user's touch position by converting the touch position into an electrical signal. However, when the window and/or the touch screen panel is disposed on the display panel, external light provided from the outside is reflected by the window and/or the touch screen to thereby generate a reflected light. As a result, a user may view the reflected light, which does not have any image information, and thus, the display quality of the flat panel display apparatus may deteriorate.

SUMMARY

Aspects of the present disclosure provide a λ/4 phase retardation film and a display apparatus having reduced reflectivity of external light.

An embodiment of the inventive concept provides a display apparatus including: a polarizer having a transmitting axis and configured to linearly polarize external light to be parallel to the transmitting axis; a phase retardation film on the polarizer and having a first optical axis; a touch member having a second optical axis and including a touch substrate on the polarizer and touch electrodes on the touch substrate; and a display panel on the polarizer. When a first in-plane retardation value of the phase retardation film is $Rp_1$, a second in-plane retardation value of the touch member is $Rp_2$, a target in-plane retardation value is $Rp_g$, and 'a' is a constant, an equation $Rp_1=Rp_g-a*Rp_2$ is satisfied.

In an embodiment, the touch member may be between the phase retardation film and the display panel.

In an embodiment, the touch member may be between the polarizer and the phase retardation film.

In an embodiment, an angle between the transmitting axis and the first optical axis may be in a range of about 43° to about 47° or in a range of about 133° to about 137°.

In an embodiment, the target in-plane retardation value $Rp_g$ may have a value in a range of about 140 nm to about 200 nm.

In an embodiment, the target in-plane retardation value may have a value of about ¼ of the wavelength of the external light.

In an embodiment, the constant a may have a value in a range of about 1 to about 3.

In an embodiment, the phase retardation film may include: an A plate having a the first in-plane retardation value; and a positive C plate on the A plate and having a first thickness retardation value. When the first thickness retardation value of the positive C plate is $Rth_1$, a second thickness retardation value of the touch member is $Rth_2$, and a target thickness retardation value is $Rth_g$, an equation $Rth_1=Rth_g-Rth_2$ may be satisfied.

In an embodiment of the inventive concept, a method of manufacturing a display apparatus includes: aligning a phase retardation film having a first optical axis and a touch member having a second optical axis such that the first optical axis and the second optical axis are parallel to each other; coupling the phase retardation film and the touch member to each other; and placing the phase retardation film and the touch member between a polarizer and a display panel.

In an embodiment, the aligning of the phase retardation film and the touch member may include: determining a target in-plane retardation value; and setting a the first in-plane retardation value of the phase retardation film according to the target in-plane retardation value and a second in-plane retardation value of the touch member.

In an embodiment, the polarizer may have a transmitting axis, and an angle between the transmitting axis and the first optical axis may be in a range of about 43° to about 47° or in a range of about 133° to about 137°.

In an embodiment, the first in-plane retardation value ($Rp_1$) of the phase retardation film may satisfy an equation $Rp_1=Rp_g-a*Rp_2$, where $Rp_2$ is the second in-plane retardation value of the touch member, $Rp_g$ is the target in-plane retardation value, and 'a' is a constant.

In an embodiment, the setting of the first in-plane retardation value may include setting a refractivity of the phase retardation film according to the target in-plane retardation value and the second in-plane retardation value.

In an embodiment, the setting of the first in-plane retardation value may include setting a thickness of the phase retardation film according to the target in-plane retardation value and the second in-plane phase retardation value.

In an embodiment, the target in-plane retardation value $Rp_g$ may have a value in a range of about 140 nm to about 200 nm.

In an embodiment, the target in-plane retardation value may have a value of about ¼ of the wavelength of external light.

In an embodiment, the phase retardation film may include: an A plate having the first in-plane retardation value; and a positive C plate on the A plate and having a first thickness retardation value. When $Rth_2$ is a second thickness retardation value of the touch member and $Rth_g$ is a target thickness retardation value, the first thickness retardation value ($R_{th1}$) of the positive C plate may satisfy an equation $R_{th1}=Rth_g-Rth_2$.

In an embodiment, the manufacturing of the touch member may further include: manufacturing a touch substrate; and arranging touch electrodes on the touch substrate.

In an embodiment of the inventive concept, a λ/4 phase retardation film includes: a first phase retardation film having a first optical axis; and a second phase retardation film having a second optical axis parallel to the first optical axis and on which touch electrodes are arranged.

BRIEF DESCRIPTION OF THE FIGURES

The accompanying drawings are included to provide a further understanding of the inventive concept and are incorporated in and constitute a part of this specification. The drawings illustrate exemplary embodiments of the inventive concept and, together with the description, serve to explain aspects of the inventive concept. In the drawings.

DETAILED DESCRIPTION

Aspects and features of the present disclosure and implementation methods thereof will be clarified through the following exemplary embodiments, described with reference to the accompanying drawings. The present disclosure may, however, be embodied in different forms and should not be construed as limited to the embodiments set forth herein. These exemplary embodiments are provided so that this disclosure will be thorough and complete and will fully convey the scope of the present disclosure to those skilled in the art. Further, the present disclosure is defined by the scope of the claims and their equivalents.

It will be understood that when an element or layer is referred to as being "on," "connected to," or "coupled to" another element or layer, it may be directly on, connected, or coupled to the other element or layer or one or more intervening elements or layers may also be present. When an element is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. The same reference numerals designate the same elements. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

The terms "below", "beneath", "lower", "above", and "upper" represent spatial relativity and may be used to easily describe the correlation between an element or component and another element or component as shown in the drawings. The terms representing spatial relativity should be understood as terms including different directions of an element in use or in operation in addition to the direction shown in the drawings.

It will be understood that, although the terms first, second, etc. may be used herein to describe various elements, components, and/or sections, these elements, components, and/or sections should not be limited by these terms. These terms are used to distinguish one element, component, and/or sections from another element, component, and/or sections. Thus, for example, a first element, a first component, or a first section discussed below could be termed a second element, a second component, or a second section without departing from the teachings of the present disclosure.

Embodiments described in the disclosure are described with reference to plane views and cross-sectional views that may be ideal, schematic diagrams of the present disclosure. Accordingly, shapes in the exemplary views may be modified according to manufacturing techniques and/or allowable errors. Therefore, embodiments of the present disclosure are not limited to the specific shape illustrated in the exemplary views and may include other shapes that may be created according to various manufacturing processes. Areas exemplified in the drawings have general properties and are used to illustrate a specific shape of a semiconductor package region. Thus, the illustrated embodiments should not be construed as limiting the scope of the present disclosure.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Hereinafter, exemplary embodiments will be described in detail with reference to the accompanying drawings.

Figure 1:
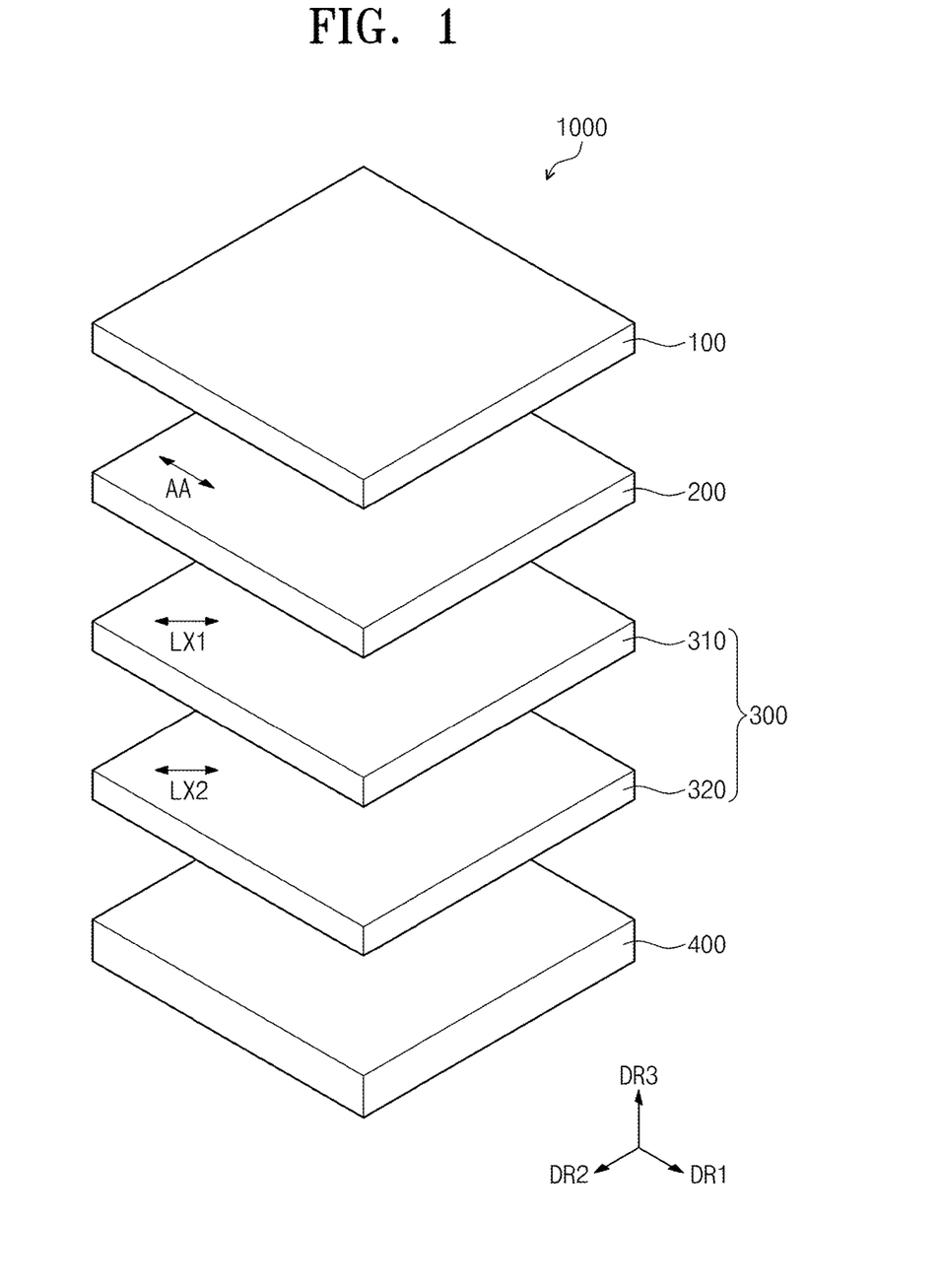
FIG. 1 is an exploded perspective view of a display apparatus according to an embodiment of the inventive concept.
Figure 2:
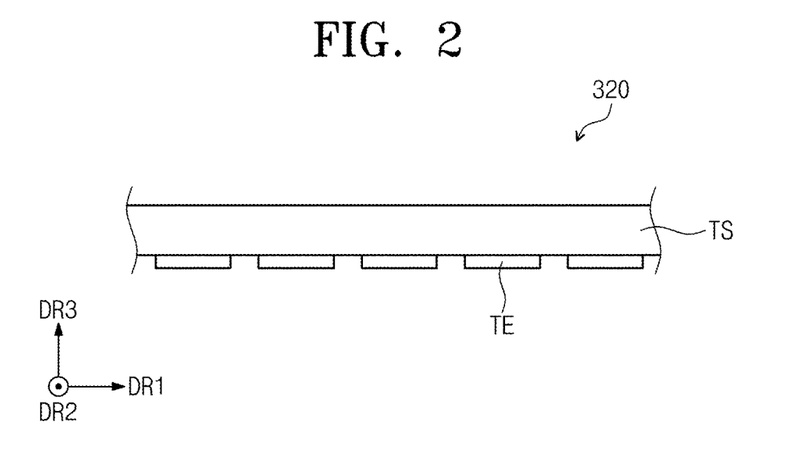
FIG. 2 is a cross-sectional view of a touch member illustrated in FIG. 1.

FIG. 1 is an exploded perspective view of a display apparatus according to an embodiment of the inventive concept, and FIG. 2 is a cross-sectional view of a touch member illustrated in FIG. 1.

Referring to FIGS. 1 and 2, a display apparatus 1000 according to an embodiment of the inventive concept includes a window member 100 (e.g., a window), a polarizer 200, a touch-integrated phase retardation film 300, and a display panel 400.

The window member 100 protects components of the display apparatus 1000 (e.g., protects components of the display apparatus 1000 under the window member 100). The window member 100 may include a transparent material, such as glass or acryl.

The polarizer 200 is disposed on (e.g., under) the window member 100. The polarizer 200 has a transmitting axis AA and an absorption axis perpendicular to the transmitting axis AA. In an embodiment of the inventive concept, the transmitting axis AA may be parallel to a first direction DR1 and the absorption axis may be parallel to a second direction DR2 perpendicular to the first direction DR1. Accordingly, a component of external light incident on the polarizer 200 that is parallel to the second direction DR2 from among the external light incident on the polarizer 200 is absorbed or reflected and may not pass through the polarizer 200, and a component of the external light that is parallel to the first direction DR1 from among the external light incident on the polarizer 200 may pass through the polarizer 200. For example, the polarizer 200 linearly polarizes the external light in the first direction DR1.

The polarizer 200 may be formed of a polymer resin extending in (or aligned along) a specific direction. However, embodiments of the inventive concept are not limited to the polarizer 200 formed of the polymer resin. For example, according to another embodiment of the inventive concept, the polarizer 200 may be a wire grid polarizer.

Also, according to another embodiment of the inventive concept, the display apparatus 1000 may further include supports disposed over and/or under the polarizer 200. The supports may support the polarizer 200 and prevent contamination and shock from the outside from damaging the display apparatus 1000.

The touch-integrated phase retardation film 300 is disposed on (e.g., under) the polarizer 200. The touch-integrated phase retardation film 300 may be formed of a material having reverse-wavelength dispersion. In one embodiment, the reverse-wavelength dispersion represents a property in that the shorter the wavelength of light at least in the visible light band incident on the touch-integrated phase retardation film 300, the less the light is phase-retarded.

The touch-integrated phase retardation film 300 has a target retardation value. Accordingly, the light passing through the touch-integrated phase retardation film 300 may be phase-retarded by the target retardation value. For example, the phase of any one component of the light components may be delayed by the target retardation value with respect to another component perpendicular to the one component. The target retardation value may be set (or determined) at a step of setting (or manufacturing) the touch-integrated phase retardation film 300. The target retardation value, as further described later, may be set so as to prevent external light from being reflected.

The touch-integrated phase retardation film 300 according to an embodiment of the inventive concept includes a phase retardation film 310 and a touch member 320 (e.g., a touch panel).

The phase retardation film 310 is disposed on (e.g., under) the polarizer 200. The phase retardation film 310 has a first optical axis LX1. The first optical axis LX1 may define an angle (e.g., a predetermined angle) with the transmitting axis AA of the polarizer 200. According to an embodiment of the inventive concept, the angle between the first optical axis LX1 and the transmitting axis AA may be in a range from about 43° to about 47° or in a range from about 133° to about 137° and, in some embodiments, may be about 45° or about 135°.

The phase retardation film 310 has an optical anisotropy (e.g., is optically anisotropic). Accordingly, the phase retardation film 310 changes the polarization state of the incident light.

The phase retardation film 310 may have a first retardation value. For example, the phase retardation film 310 delays the phase of any one component of the components of the light incident on the phase retardation film 310 by the first retardation value with respect to the phase of another component perpendicular to the one component. For example, the light incident on the phase retardation film 310 may be decomposed into a first component parallel to a first direction DR1, a second component parallel to a second direction DR2, and a third component parallel to a third direction DR3. In one embodiment, the third direction DR3 is defined as a direction perpendicular to both the first and second directions DR1 and DR2.

The phase retardation film 310 may be an A plate. For example, when the refractivity of the phase retardation film 310 in the first direction DR1 is defined as a first refractivity n1, the refractivity of the phase retardation film 310 in the second direction DR2 is defined as a second refractivity n2, and the refractivity of the phase retardation film 310 in the third direction DR3 is defined as a third refractivity n3, the first to third refractivities n1 to n3 satisfy Equation 1 below.

$$n2 \approx n3 > n1 \qquad \text{[Equation 1]:}$$

According to an embodiment of the inventive concept, the second and third refractivities n2 and n3 may be substantially the same as each other. For example, the first retardation value may be a first in-plane retardation value. However, embodiments of the inventive concept are not limited thereto, and according to another embodiment of the inventive concept, the second and third refractivities n2 and n3 may be different from each other. When the second and third refractivities n2 and n3 have a difference therebetween (e.g., a predetermined difference therebetween), the phase retardation film 310 has a thickness retardation value (e.g., a predetermined thickness retardation value).

The first in-plane retardation value increases as the value of differences from among the components of the phase retardation film 310 increases or as the optical distance of the phase retardation film 310 increases.

One component of the light passing through the phase retardation film 310 is phase-retarded by the first in-plane retardation value such that the light may be changed from a linear polarization state into a circular polarization state or from the circular polarization state into the linear polarization state.

The phase retardation film 310 may include a polycarbonate (PC)-based resin, a cyclo-olefin polymer (COP)-based resin, an acryl-based resin, and/or a cellulose-based resin.

The touch member 320 is disposed on (e.g., under) the phase retardation film 310. The touch member 320 may be a resistive-type touch member or a capacitive-type touch member.

The touch member 320 may be attached to the phase retardation film 310 by an adhesive. According to an embodiment of the inventive concept, the touch member 320 may be attached to the phase retardation film 310 to thereby form an integral member or component.

The touch member 320 includes a touch substrate TS and a plurality of touch electrodes TE. The touch substrate TS supports the touch electrodes TE.

The touch substrate TS may extend in a direction (e.g., in a predetermined direction). The extension direction of the touch substrate TS is defined as a machinery direction MD. The touch substrate TS may have a second optical axis LX2. According to an embodiment of the inventive concept, the second optical axis LX2 may be parallel to the machinery direction MD. However, embodiments of the inventive concept are not limited thereto. For example, as will be further described later, according to another embodiment of the inventive concept, the direction of the second optical axis LX2 may be tilted with respect to the machinery direction MD by a distance (e.g., by a predetermined distance or angle).

The touch substrate TS includes a transparent material. The touch substrate TS may include polyethylene terephthalate (PET), polyimide (PI), acryl, polycarbonate (PC), triacetate cellulose (TAC), polymethylmethacrylate (PMMA), polyethersulfone (PES), polyethylene naphthalate (PEN), and/or glass.

The touch electrodes TE may be disposed so as to be spaced from (e.g., spaced apart from) each other, for example, in the first direction DR1 on the touch substrate TS. The touch electrodes TE include conductive materials. For example, the touch electrodes TE may include indium tin oxide (ITO), copper (Cu), silver (Ag), aluminum (Al), nickel (Ni), chrome (Cr), and/or nickel-phosphorus (Ni—P).

The touch substrate TS has an optical anisotropy (e.g., is optically anisotropic). Accordingly, the touch substrate TS may have a second retardation value. For example, the touch substrate TS delays the phase of any one component of the components of the light incident on the touch substrate TS by the second retardation value with respect to the phase of another component perpendicular to the one component. For example, the light incident on the touch substrate TS may be decomposed into a first component parallel to a first direction DR1, a second component parallel to a second direction DR2, and a third component parallel to a third direction DR3.

According to this embodiment, the second retardation value may be a second in-plane retardation value. The greater the difference value of the refractivity with respect to each component of the touch substrate TS or the greater the optical distance of the touch substrate TS, the greater the second in-plane retardation value may be.

The display panel 400 is disposed on the touch substrate TS. The display panel 400 according to an embodiment of the inventive concept may be an organic light emitting display panel. The display panel 400 displays an image. An image generated by the display panel 400 may be provided to a viewer by passing through the window member 100.

The display panel 400 has pixel regions. The display panel 400 includes one or more pixel, each including an organic light-emitting diode which generates display light, at each of the pixel regions.

Figure 3:
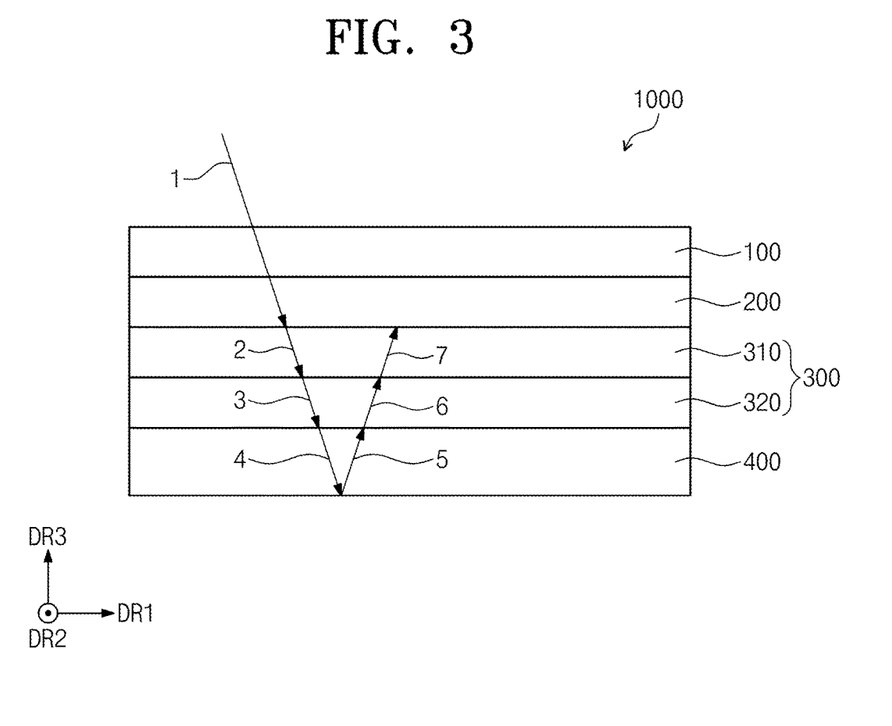
FIG. 3 is a cross-sectional view of a display apparatus according to an embodiment of the inventive concept.
Figure 4:
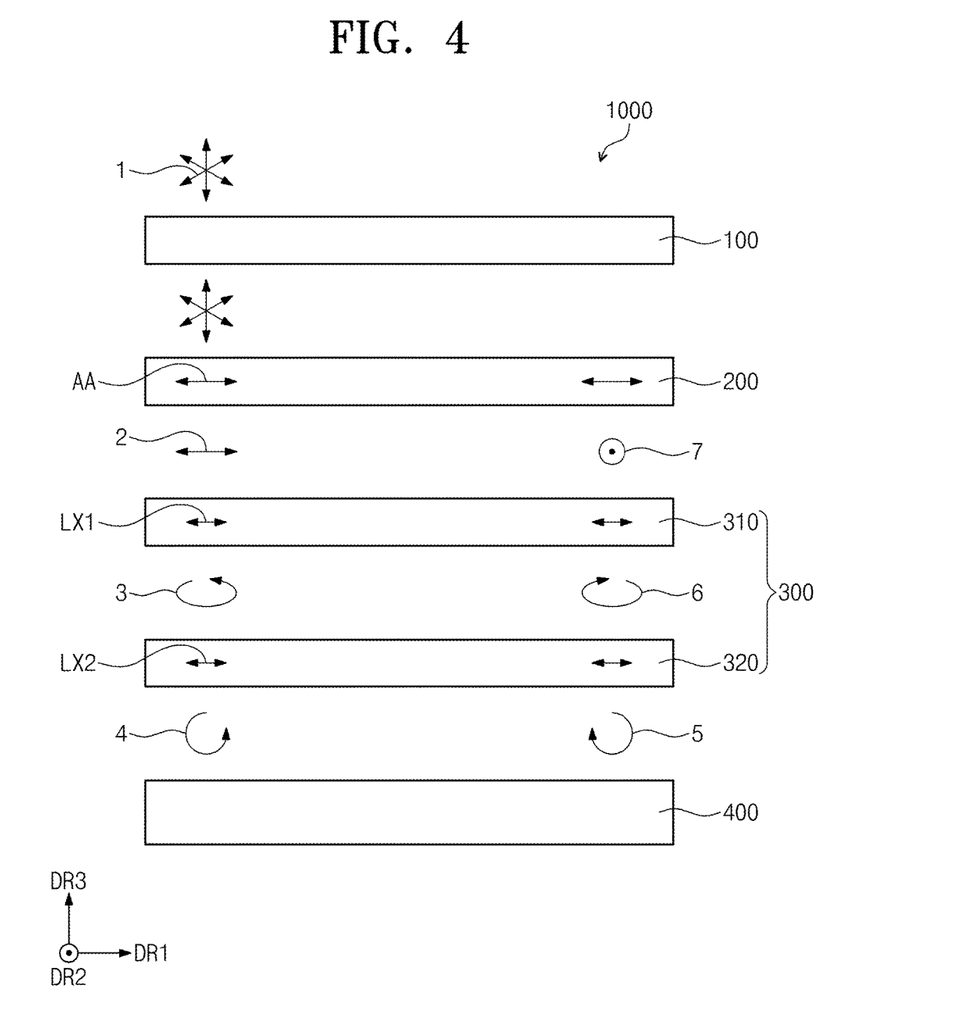
FIG. 4 is a schematic view illustrating a principle of displaying images and absorbing external light in the display apparatus illustrated in FIG. 1.

FIG. 3 is a cross-sectional view of a display apparatus according to an embodiment of the inventive concept, and FIG. 4 is a schematic view illustrating a principle of displaying images and absorbing external light in the display apparatus illustrated in FIG. 1.

Referring to FIGS. 3 and 4, external light 1 incident on the polarizer 200 from the outside through the window member 100 may be unpolarized light. Unpolarized light is light in which linearly polarized components that are polarized in all directions and circularly polarized components that are circularly polarized, including left circularly polarized components and right circularly polarized components, overlap with each other.

The external light 1 is incident on the polarizer 200 through the window member 100. The polarizer 200 linearly polarizes the incident external light 1. Accordingly, the unpolarized external light 1 may be polarized in a direction parallel to the transmitting axis AA while passing through the polarizer 200 along the transmitting axis AA. For example, the external light 1 may be polarized in the first direction DR1 while passing through the polarizer 200 along the transmitting axis AA to become linearly polarized light 2.

The linearly polarized light 2 is incident on the phase retardation film 310. The phase of one component of the light 2 incident on the phase retardation film 310 is delayed by the first retardation value while passing through the phase retardation film 310. For example, the phase retardation film 310 may elliptically polarize the incident light 2.

When the angle between the first optical axis LX1 and the transmitting axis AA is in a range of about 43° to about 47°, the elliptical polarization may be a left elliptical polarization, and when the angle is in a range of about 133° to about 137°, the circular polarization may be a right elliptical polarization. In an embodiment of the inventive concept, the elliptical polarization may be the left elliptical polarization.

Left elliptically polarized light 3 is incident on the touch member 320. The phase of one component of the light 3 incident on the touch member 320 is delayed by the second retardation value while passing through the touch member 320 and may be substantially circularly polarized. In an embodiment of the inventive concept, the circular polarization may be the left circular polarization.

Left circularly polarized light 4 passing through the touch member 320 is incident on the display panel 400. Most of the light 4 incident on the display panel 400 is reflected by a reflective electrode in the display panel 400, and the polarization state thereof may be inverted. According to an embodiment of the inventive concept, the light 4 incident on the display panel 400 after being left circularly polarized may be right circularly polarized.

One component of right circularly polarized light 5 is phase-retarded by the second retardation value while passing through the touch member 320 again and is thereby right elliptically polarized. Right elliptically polarized light 6 is incident on the phase retardation film 310.

The light 6 incident onto the phase retardation film 310 is phase-retarded by the first retardation value while passing through the phase retardation film 310 again, and the right elliptically polarized light 6 may be linearly polarized. In the illustrated embodiment, the polarization direction of linearly polarized light 7 is parallel to the second direction DR2 because the phase of the light is inverted due to being reflected by the display panel 400.

The linearly polarized light 7 is incident on the polarizer 200. The linearly polarized light 7 has only a component perpendicular to the transmitting axis AA (e.g., all of the linearly polarized light 7 is perpendicular to the transmitting axis AA). For example, the linearly polarized light 7 may have only the second component parallel to an absorbing axis. Accordingly, the linearly polarized light 7 may not pass through the polarizer 200 but is reflected and/or absorbed by the polarizer 200.

Figure 5:
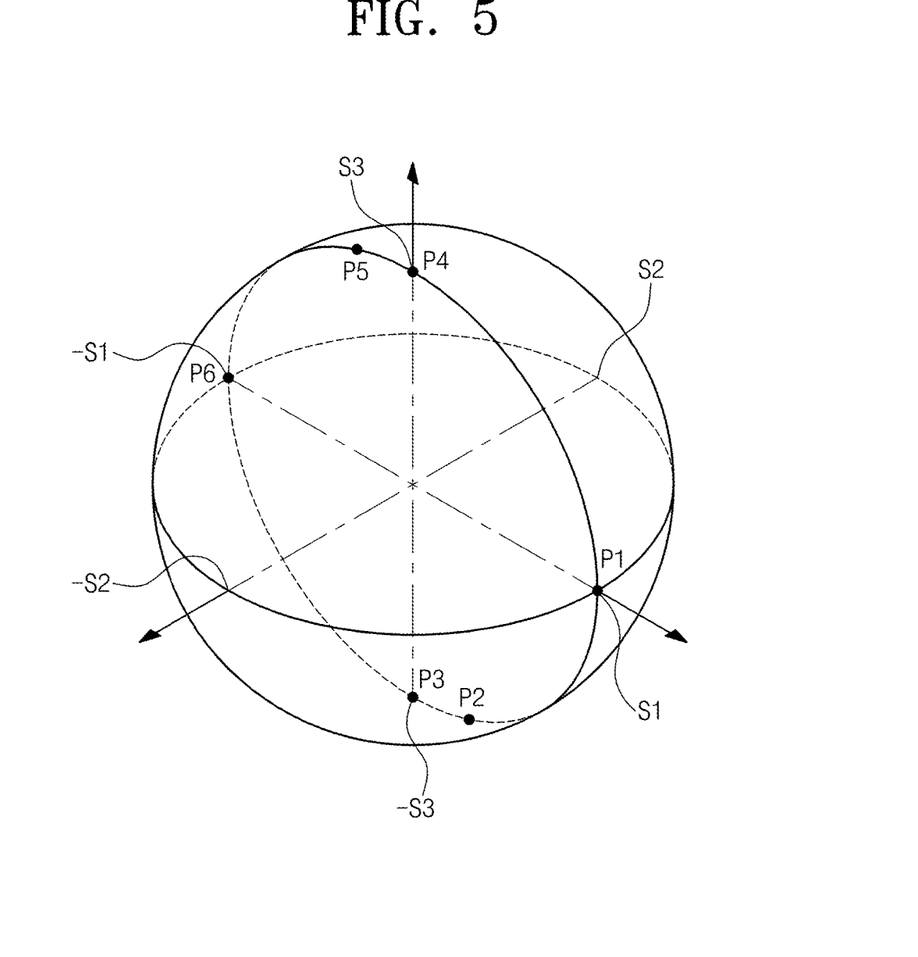
FIG. 5 is a Poincarésphere illustrating a polarized state of light incident on the display apparatus illustrated in FIG. 1.

FIG. 5 is a Poincaré sphere illustrating changes in a polarized state of light incident on the display apparatus illustrated in FIG. 1.

Hereinafter, referring to FIG. 4 and the Poincaré sphere of FIG. 5, the changes in the polarization state of the light incident on the display apparatus 1000 will be further described.

All polarization states which arbitrary light may have are represented by points on the spherical surface of the Poincaré sphere or points inside the spherical surface. When the optical axis, the retardation axis, and retardation value of an optical element are determined, the polarization state of the light after passing through the optical element may be easily determined by using the Poincaré sphere, and thus, the Poincaré sphere may be used for designing a phase retardation film.

In the Poincaré sphere, points on the equator represent the linearly polarized state of light. A first polar point S1, a first opposite polar point −S1, a second polar point S2, and the second opposite polar point −S2 are positioned on the equator. The first polar point S1 represents a linearly polarized state of light in the first direction DR1. The first opposite polar point −S1 is opposite to the first polar point S1 with respect to the origin and represents a linearly polarized state in the second direction DR2. The second polar point S2 represents a linearly polarized state which is rotated clockwise by 45° with respect to the first direction DR1. The second opposite polar point −S2 is opposite to the second polar point S2 with respect to the origin and represents a linearly polarized state which is rotated clockwise by −45° with respect to the first direction DR1.

The upper hemisphere of the Poincaré sphere represents a right elliptical polarization, and the lower hemisphere of the Poincaré sphere represents a left elliptical polarization. A third polar point S3 represents a right circular polarization, and a third opposite polar point −S3 opposite to the third polar point S3 with respect to origin represents a left circular polarization. The closer toward the third polar point S3 from the equator, the closer toward the right circular polarization state from the linear polarization state, and the closer toward the third opposite polar point −S3 from the equator, the closer toward the left circular polarization state from the linear polarization state.

The light 2 incident from the outside and passing through the polarizer 200 is polarized in the first direction DR1 and is therefore positioned at a first point P1 on the Poincaré sphere. Subsequently, the light 3 incident onto the phase retardation film 310 from the polarizer 200 and passing through the phase retardation film 310 is phase-retarded by the first retardation value, and the light 3 passing through the phase retardation film 310 is left elliptically polarized and is therefore moved to a second point P2 from the first point P1.

Subsequently, the light 4 incident from the phase retardation film 310 and passing through the touch member 320 is phase-retarded by the second retardation value, and the light 4 passing through the touch member 320 is left circularly polarized and is therefore moved from the second position P2 to a third position P3 on the Poincaré sphere.

Subsequently, the light 4 passing through the touch member 320 is reflected by the display panel 400. The reflected light 5 is phase-inverted to be right circularly polarized, and thus, is moved from the third point P3 to a fourth point P4.

The right circularly polarized light 5 is phase-retarded by the second retardation value while passing through the touch member 320, is right elliptically polarized, and is therefore moved from the fourth point P4 to a fifth point P5 on the Poincaré sphere.

Subsequently, the light 6 incident from the touch member 320 and passing through the phase retardation film 310 is phase-retarded by the first retardation value, and the light 6 passing through the phase retardation film 310 is linearly polarized in the second direction DR2 and is therefore moved from the fifth point P5 to a sixth point P6 on the Poincaré sphere. Because the sixth point P6 corresponds to the absorbing axis of the polarizer 200, the light 7 passing through and linearly polarized by the phase retardation film 310 is parallel to the absorbing axis. Accordingly, the light 7 passing through and linearly polarized by the phase retardation film 310 is absorbed by the polarizer 200 (e.g., is absorbed by the absorbing axis of the polarizer 200) and, thus, may not thereby pass through the polarizer 200 (e.g., may be blocked by the polarizer 200). The point corresponding to the absorbing axis is defined as an extinction point.

As described above, the polarization path of the light incident on the display apparatus 1000 from the outside, as illustrated in FIG. 3, may be defined as the path passing through the phase retardation film 310, the touch member 320, the display panel 400, the touch member 320, and the phase retardation film 310.

According to an embodiment of the inventive concept, a target retardation value of the touch-integrated phase retardation film 300 may be defined as the retardation value which leads the polarization state of the light propagating along the polarization path to be positioned at the extinction point. For example, the target retardation value of the touch-integrated phase retardation film 300 may be the retardation value which leads the polarization state of the light propagating along the polarization path to be parallel to the absorbing axis.

Accordingly, when the touch-integrated phase retardation film 300 has the target retardation value, the polarization state of external light traveling along the polarization path reaches the extinction point on the Poincaré sphere, and as a result, reflected external light may be prevented from being viewed (e.g., may be prevented from exiting the display apparatus 1000).

According to an embodiment of the inventive concept, the target retardation value may be a target in-plane retardation value, and the target in-plane retardation value may have a value corresponding to ¼ of the wavelength (λ/4) of incident light. For example, the target retardation value may be in a range of about 140 nm to about 200 nm.

According to an embodiment of the inventive concept, the target in-plane retardation value of the touch-integrated phase retardation film 300 satisfies Equation 2.

$$Rp_1 = Rp_g - a*Rp_2 \qquad \text{[Equation 2]:}$$

Here, the first in-plane retardation value is $Rp_1$, the second in-plane retardation value is $Rp_2$, the target in-plane retardation value is $Rp_g$, and a is a constant. For example, the constant a may have a value in a range from about 1 to about 3.

As described above, the touch-integrated phase retardation film 300 has the target in-plane retardation value so that the polarization state of the light 7 which is reflected from the display panel 400 and is linearly polarized reaches the extinction point on the Poincaré sphere, and the polarized light of the linearly polarized light 7 may be parallel to the absorbing axis of the polarizer 200. Thus, the linearly polarized light 7 is absorbed by the polarizer 200 and the reflection of external light from the display apparatus 1000 may thereby be reduced or effectively prevented.

Different from embodiments of the inventive concept, when the first in-plane retardation value is determined based on the target in-plane retardation value without considering the second in-plane retardation value, the external light may be further phase-retarded by the second in-plane retardation value. For example, an error may be generated between the target in-plane retardation value and the actual in-plane retardation value. In this case, the polarization state of external light traveling along the polarization path may not reach the extinction point.

However, according to embodiments of the inventive concept, the first in-plane retardation value of the phase retardation film 310 is determined according to Equation 2 on the basis of the second in-plane retardation value and the target in-plane retardation value. Accordingly, the reflection of external light from the display apparatus 1000 may be reduced or effectively prevented.

As a result, according to an embodiment of the inventive concept, because the first in-plane retardation value of the phase retardation film 310 may be determined on the basis of the second in-plane retardation value and the target in-plane retardation value, it is possible to prevent the reflected light from being viewed by a user or to reduce an amount of the reflected light that is visible to the user by changing the polarization state of the light incident on the display apparatus 1000.

Figure 6:
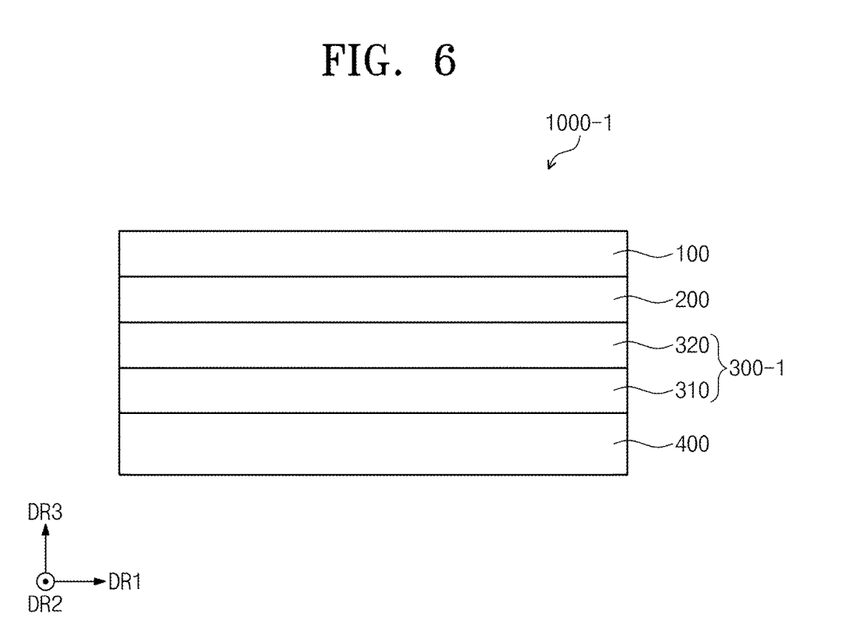
FIG. 6 is a cross-sectional view of a display apparatus according to another embodiment of the inventive concept.

FIG. 6 is a cross-sectional view of a display apparatus according to another embodiment of the inventive concept. In describing FIG. 6, previously described components are designated by the same reference numerals, and repeated descriptions thereof may not be provided.

Referring to FIG. 6, in a touch-integrated phase retardation film 300-1 of a display apparatus 1000-1 according to an embodiment of the inventive concept, the disposition of (e.g., the arrangement order of) the phase retardation film 310 and the touch member 320 may be changed with respect to the display apparatus 1000 as shown in FIG. 1. For example, the touch member 320 may be disposed between the polarizer 200 and the phase retardation film 310.

Figure 7:
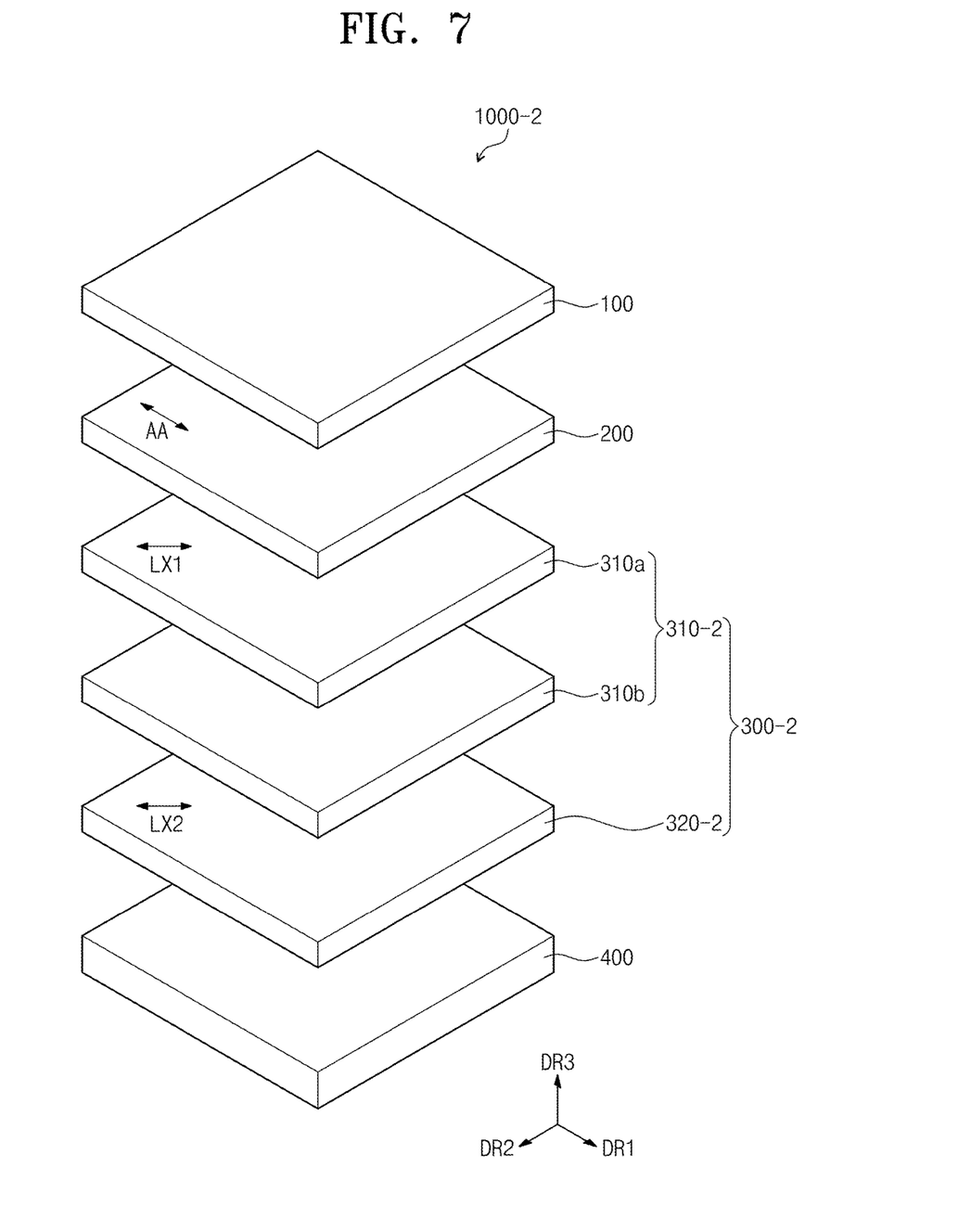
FIG. 7 is an exploded perspective view of a display apparatus according to another embodiment of the inventive concept.

FIG. 7 is an exploded perspective view of a display apparatus according to another embodiment of the inventive concept. In describing FIG. 7, previously described components are designated by the same reference numerals, and repeated descriptions thereof may not be provided.

Referring to FIG. 7, a phase retardation film 310-2 of a display apparatus 1000-2 according to an embodiment of the inventive concept includes an A plate 310a and a positive C plate 310b.

The A plate 310a has a first in-plane retardation value. The A plate 310a is the same or is substantially the same as the phase retardation film 310 described above. Accordingly, the description thereof may not be repeated.

The positive C plate 310b may have a first thickness retardation value. Accordingly, one component of the light passing through the positive C plate 310b may be phase-retarded by the first thickness retardation value.

When the refractivity of the positive C plate 310b in the first direction DR1 is defined as a fourth refractivity n4, the refractivity in the second direction DR2 is defined as a fifth refractivity n5, and the refractivity in the third direction DR3 is defined as a sixth refractivity n6, the fourth to sixth refractivities n4 to n6 satisfy Equation 3 below.

$$n4 \approx n5 < n6 \qquad \text{[Equation 3]:}$$

According to this embodiment, a second retardation value of a touch member 320-2 may include a second thickness retardation value.

A target retardation value of a touch-integrated phase retardation film 300-2 according to this embodiment may include a target thickness retardation value. The target thickness retardation value of the touch-integrated phase retardation film 300-2 satisfies Equation 4.

$$R_{th1} = Rth_g - Rth_2 \qquad \text{[Equation 4]:}$$

Here, the first thickness retardation value is $Rth_1$, the second thickness retardation value is $Rth_2$, and the target thickness retardation value is $Rth_g$. For example, the target thickness retardation value may have a value in a range of about 0 nm to about 300 nm.

As such, according to an embodiment of the inventive concept, the first thickness retardation value may be set on the basis of the target thickness retardation value and the second thickness retardation value. In an embodiment of the inventive concept, the target retardation value may be set similar to the above-mentioned target in-plane retardation value, and the second thickness retardation value may be determined by measuring a touch substrate TS before manufacturing (e.g., before starting to manufacture) the phase retardation film 310. According to an embodiment of the inventive concept, it is possible to prevent external light from exiting the display apparatus 100-2 and from being viewed by a user or to reduce an amount of the external light exiting the display apparatus 100-2 and being viewed by the user.

Figure 8:
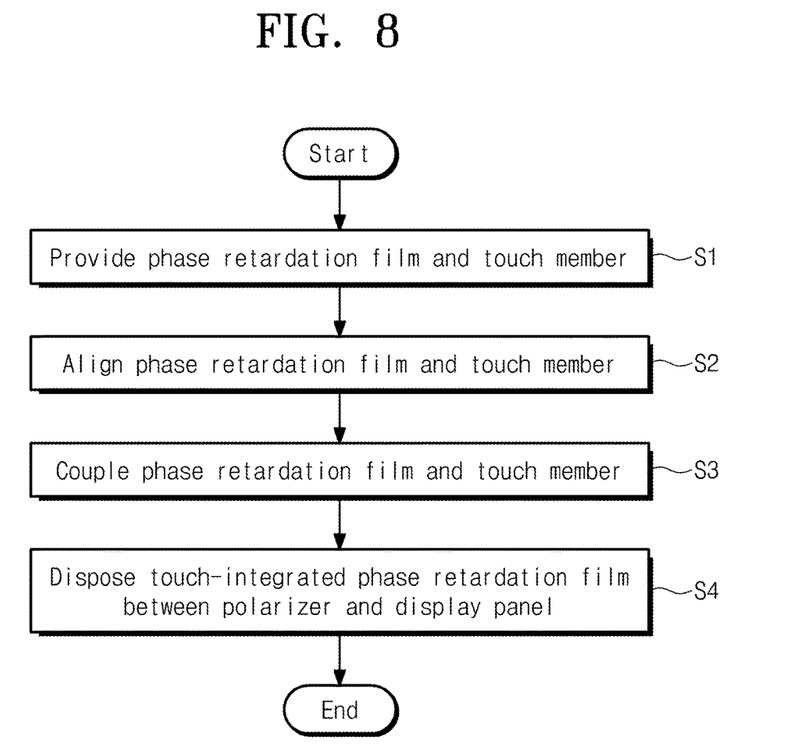
FIG. 8 is a flowchart of a method of manufacturing the display apparatus illustrated in FIG. 1.
Figure 9:
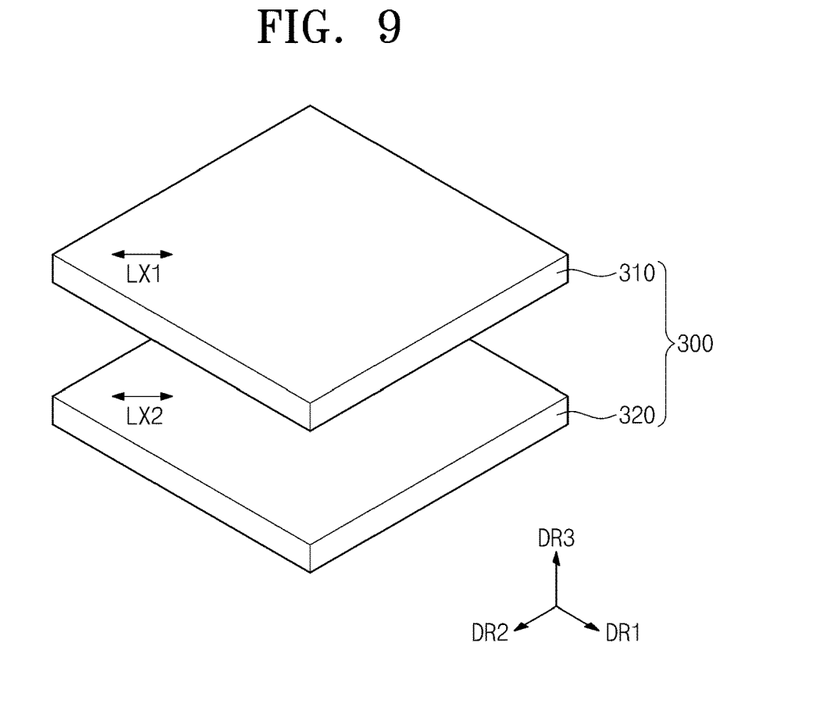
FIG. 9 is a perspective view of a phase retardation film and a touch member at step S1 of the method illustrated in FIG. 8.
Figure 10:
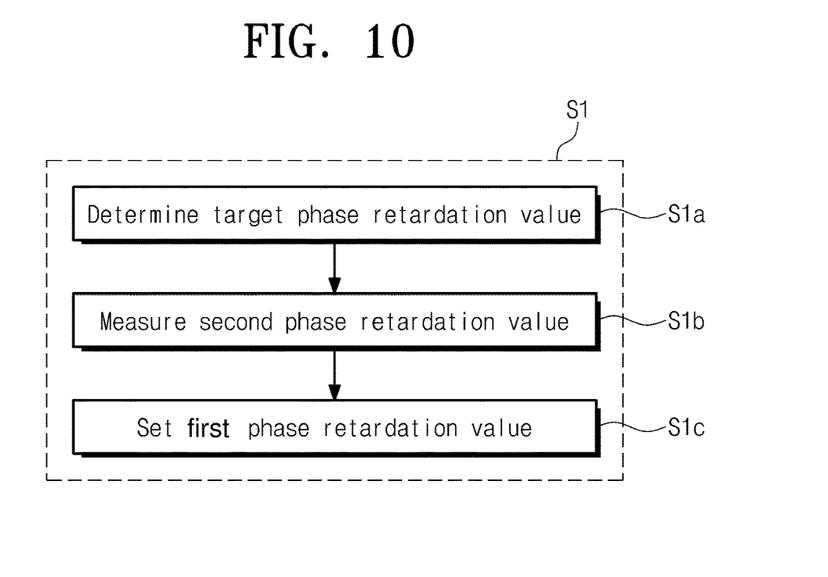
FIG. 10 is a flowchart of a method of manufacturing a phase retardation film and a touch member.

FIG. 8 is a flowchart of a method of manufacturing the display apparatus illustrated in FIG. 1, and FIG. 9 is a perspective view of a phase retardation film and a touch member at step S1 of the method illustrated in FIG. 8. FIG. 10 is a flowchart of a method of manufacturing a phase retardation film and a touch member.

Referring to FIGS. 8-10, a phase retardation film 310 and a touch member 320 are provided (S1). The description of the phase retardation film 310 and the touch member 320 are the same or are substantially the same as those described above with reference to FIG. 1.

The phase retardation film 310 includes a material having an optical anisotropy (e.g., an optically anisotropic material). According to this embodiment, the phase retardation film 310 may have a first optical axis LX1 parallel to a first direction DR1. The phase retardation film 310 delays the phase of any one component of the components of the light incident on the phase retardation film 310 by the first retardation value with respect to the phase of another component perpendicular to the one component.

The touch member 320 may be manufactured by extending a touch substrate TS in a direction MD. In addition, touch electrodes TE may be disposed on the extended touch substrate TS. Through the extension process of the touch substrate TS, a second optical axis LX2 may be formed in the touch substrate TS. The direction of the second optical axis LX2 may be parallel to the direction MD.

The touch member 320 delays the phase of any one component of the components of the light incident on the touch member 320 by the second retardation value with respect to the phase of another component perpendicular to the one component. The second retardation value may be generated through the extension process of the touch member 320, and the second retardation value may be set by measuring the retardation value of the touch member 320 after manufacturing the touch member 320.

According to embodiments of the inventive concept, the first retardation value of the phase retardation film 310 is based on the target retardation value and the second retardation value. For example, the phase retardation film 310 may be manufactured on the basis of the target retardation value and the second retardation value.

Referring to FIG. 10, before manufacturing the phase retardation film 310 and the touch member 320, the target retardation value of the display apparatus 1000 is determined (S1a). As described above, the target retardation value leads the polarization state of the light propagating along the polarization path to be parallel to an absorbing axis. For example, because the polarization state of the light propagating along the polarization path may reach the extinction point by the target retardation value, the reflection of external light may be reduced or prevented.

According to an embodiment of the inventive concept, the target retardation value may be a target in-plane retardation value, and the target in-plane retardation value may have a value corresponding to ¼ of the wavelength (λ/4) of incident light. For example, the target retardation value may have a value in a range of about 140 nm to about 200 nm.

After the target retardation value is determined (S1a), a second retardation value of the touch member is measured (S1b). For example, the second retardation value may be set by measuring the touch member 320. Subsequently, the first retardation value of the phase retardation film 310 may be set to satisfy the above-mentioned Equation 2 (S1c).

$$Rp_1 = Rp_g - a*Rp_2 \quad \text{[Equation 2]}$$

The phase retardation film 310 may be manufactured to have a first retardation value which is set as described above. Also, the touch member 320 may be provided by selecting a specific touch member 320 having a first retardation value from among a plurality of touch members which are already manufactured to have retardation values different from one another.

The phase retardation film 310 may be manufactured to have a first retardation value by adjusting the refractivity of the phase retardation film 310 or by adjusting the thickness of the phase retardation film 310. The greater the difference between each of the components of the phase retardation film 310 or the greater the optical distance of the phase retardation film 310, the greater the first in-plane retardation value is.

Subsequently, the phase retardation film 310 and the touch member 320 are aligned (S2). In one embodiment, a first optical axis LX1 of the phase retardation film 310 may be aligned to be parallel to the touch member 320.

Heretofore, an embodiment of the inventive concept in which the second retardation value is measured, a first retardation value is determined on the basis of the second retardation value and the target retardation value, and the phase retardation film is manufactured so as to have the first retardation value as has been described. However, the inventive concept is not limited thereto. For example, according to another embodiment of the inventive concept, a first retardation value is measured, a second retardation value is determined on the basis of the first retardation value and the target retardation value, and a touch member may be manufactured so as to have the second retardation value.

Figure 11:
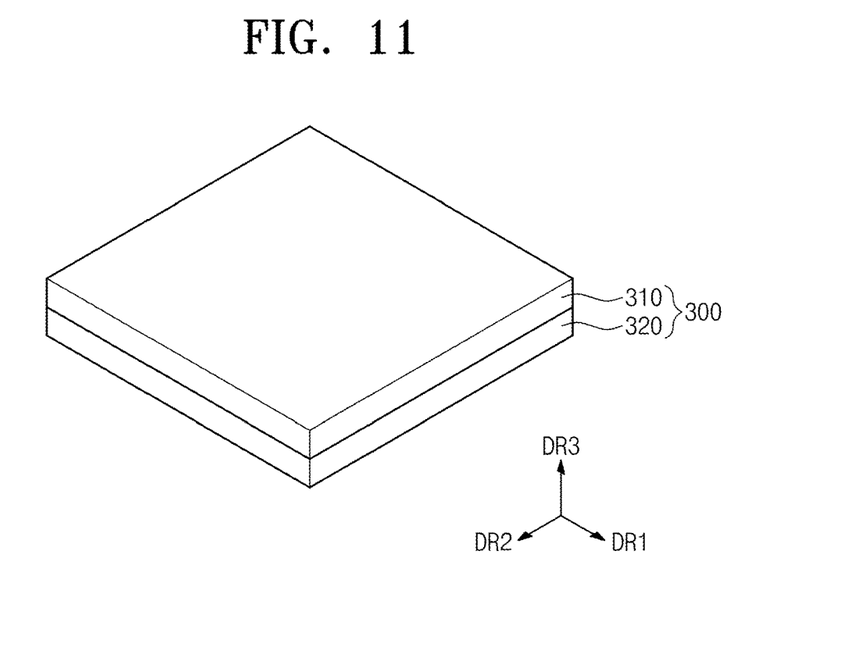
FIG. 11 is a perspective view of the phase retardation film and the touch member at step S3 of the method illustrated in FIG. 8.

FIG. 11 is a perspective view of a phase retardation film and a touch member at step S3 of the method illustrated in FIG. 8.

Referring further to FIG. 11, a phase retardation film 310 and a touch member 320 are aligned such that a first optical axis LX1 and a second optical axis LX2 are parallel to each other (S2), and the phase retardation film and the touch member 320 are then coupled to each other. The phase retardation film 310 and the touch member 320 are coupled to form a touch-integrated phase retardation film 300. In an embodiment of the inventive concept, the touch member 320 and the phase retardation film 310 may be attached to each other by a transparent adhesive.

Figure 12:
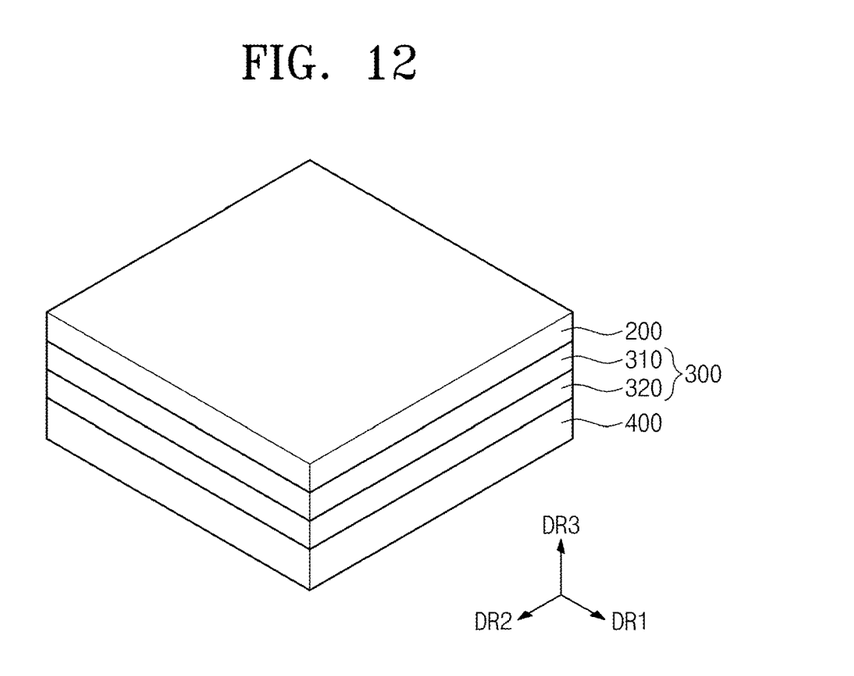
FIG. 12 is a perspective view of a display apparatus at step S4 of the method illustrated in FIG. 8.

FIG. 12 is a perspective view of a display apparatus at step S4 of the method illustrated in FIG. 8.

Referring further to FIG. 12, the touch-integrated phase retardation film 300 is disposed between a polarizer 200 and a display panel 400 (S4). A window member may be disposed on the polarizer 200.

The touch-integrated phase retardation film 300 circularly polarizes the linearly polarized light incident from the polarizer 200 and linearly polarizes the circularly polarized incident light which is reflected from the display panel 400 so as to be parallel to an absorbing axis of the polarizer 200.

As a result, according to an embodiment of the inventive concept, because the first in-plane retardation value of the phase retardation film 310 may be determined on the basis of the target in-plane retardation value and the second in-plane retardation value, it is possible to prevent the reflected light from being viewed by a user or to reduce an amount of the reflected light visible to the user by changing the polarization state of the light incident on the display apparatus 1000.

According to embodiments of the inventive concept, reflectivity of external light may be reduced.

While exemplary embodiments are described above, a person skilled in the art will understand that many modifications and variations may be made therein without departing from the spirit and scope of the present invention defined in the following claims and their equivalents. Also, embodiments disclosed in the present disclosure are not intended to limit the technical spirit of the present invention and the following claims, and all technical spirits falling within equivalent scope of the claims are included in the scope of rights of the present invention.

What is claimed is:

1. A display apparatus comprising:
   a polarizer having a transmitting axis and configured to linearly polarize external light to be parallel to the transmitting axis;
   a phase retardation film under the polarizer and having a first optical axis;
   a touch member under the phase retardation film and having a second optical axis parallel to the first optical; and
   a display panel disposed under the touch member,
   wherein, when a first in-plane retardation value of the phase retardation film is Rp1, a second in-plane retardation value of the touch member is Rp2, a target in-plane retardation value is $Rp_g$, and 'a' is a constant, an equation $Rp_1 = Rp_g - a*Rp_2$ is satisfied.

2. The display apparatus of claim 1, wherein the touch member is between the phase retardation film and the display panel.

3. The display apparatus of claim 1, wherein the touch member comprises a touch substrate under the polarizer and touch electrodes under the touch substrate.

4. The display apparatus of claim 1, wherein an angle between the transmitting axis and the first optical axis is in a range of about 43° to about 47° or in a range of about 133° to about 137°.

5. The display apparatus of claim 1, wherein the target in-plane retardation value $Rp_g$ has a value in a range of about 140 nm to about 200 nm.

6. The display apparatus of claim 1, wherein the target in-plane retardation value has a value of about ¼ of a wavelength of the external light.

7. The display apparatus of claim 1, wherein the constant 'a' has a value in a range of about 1 to about 3.

8. The display apparatus of claim 1, wherein the phase retardation film comprises:
an A plate having the first in-plane retardation value; and
a positive C plate on the A plate and having a first thickness retardation value, and
wherein, when the first thickness retardation value of the positive C plate is $Rth_1$, a second thickness retardation value of the touch member is $Rth_2$, and a target thickness retardation value is $Rth_g$, an equation $Rth_1 = Rth_g - Rth_2$ is satisfied.

9. A method of manufacturing a display apparatus, the method comprising:
aligning a phase retardation film having a first optical axis and a touch member having a second optical axis such that the first optical axis and the second optical axis are parallel to each other;
coupling the phase retardation film and the touch member to each other; and
placing the phase retardation film and the touch member between a polarizer and a display panel,
wherein the aligning of the phase retardation film and the touch member comprises:
determining a target in-plane retardation value; and
setting a first in-plane retardation value of the phase retardation film according to the target in-plane retardation value and a second in-plane retardation value of the touch member.

10. The method of claim 9, wherein the manufacturing of the touch member further comprises:
manufacturing a touch substrate; and
arranging touch electrodes on the touch substrate.

11. The method of claim 9, wherein the polarizer has a transmitting axis, and
wherein an angle between the transmitting axis and the first optical axis of the polarizer is in a range of about 43° to about 47° or in a range of about 133° to about 137°.

12. The method of claim 9, wherein the first in-plane retardation value ($Rp_1$) of the phase retardation film satisfies an equation $Rp_1 = Rp_g - a*Rp_2$, where $Rp_2$ is the second in-plane retardation value of the touch member, $Rp_g$ is the target in-plane retardation value, and 'a' is a constant.

13. The method of claim 9, wherein the setting of the first in-plane retardation value comprises setting a refractivity of the phase retardation film according to the target in-plane retardation value and the second in-plane retardation value.

14. The method of claim 9, wherein the setting of the first in-plane retardation value comprises setting a thickness of the phase retardation film according to the target in-plane retardation value and the second in-plane retardation value.

15. The method of claim 9, wherein the target in-plane retardation value ($Rp_g$) has a value in a range of about 140 nm to about 200 nm.

16. The method of claim 9, wherein the target in-plane retardation value has a value of about ¼ of a wavelength of an external light.

17. The method of claim 9, wherein the phase retardation film comprises:
an A plate having the first in-plane retardation value; and
a positive C plate on the A plate and having a first thickness retardation value,
wherein, when $Rth_2$ is a second thickness retardation value of the touch member, and $Rth_g$ is a target thickness retardation value, the first thickness retardation value ($Rth_1$) of the positive C plate satisfies an equation $Rth_1 = Rth_g - Rth_2$.

18. A display apparatus comprising:
a polarizer having a transmitting axis and configured to linearly polarize external light to be parallel to the transmitting axis;
a touch member under the polarizer and having a first optical axis;
a phase retardation film under the touch member and having a second optical axis parallel to the first optical axis; and
a display panel disposed under the touch member,
wherein, when a first in-plane retardation value of the phase retardation film is $Rp_1$, a second in-plane retardation value of the touch member is $Rp_2$, a target in-plane retardation value is $Rp_g$, and 'a' is a constant, an equation $Rp_1 = Rp_g - a*Rp_2$ is satisfied.

* * * * *